United States Patent
Chiu

(10) Patent No.: US 6,312,262 B1
(45) Date of Patent: Nov. 6, 2001

(54) STRUCTURE OF A PLASTIC CPU FOLDABLE FIXING FRAME

(75) Inventor: Te-Chao Chiu, Taipei Hsien (TW)

(73) Assignee: Wiesen Electronic Co., Ltd., Taipei Hsien (TW)

( * ) Notice: Subject to any disclaimer, the term of this patent is extended or adjusted under 35 U.S.C. 154(b) by 0 days.

(21) Appl. No.: 09/335,262

(22) Filed: Jun. 17, 1999

(51) Int. Cl.[7] .................................................. H01R 9/09
(52) U.S. Cl. ...................................................... 439/64
(58) Field of Search ...................................... 439/64, 377

(56) References Cited

U.S. PATENT DOCUMENTS

| | | | |
|---|---|---|---|
| 5,928,024 | * 7/1999 | Ming-Huang | 439/377 |
| 5,980,299 | * 11/1999 | Davis | 439/377 |
| 6,031,725 | * 2/2000 | Scholder et al. | 439/759 |
| 6,074,231 | * 6/2000 | Ju | 439/327 |
| 6,083,026 | * 7/2000 | Trout et al. | 439/328 |
| 6,089,899 | * 7/2000 | Wang et al. | 439/377 |
| 6,089,900 | * 7/2000 | Ma | 439/377 |
| 6,111,747 | * 8/2000 | Jeffries et al. | 439/377 |

* cited by examiner

*Primary Examiner*—Brian Sircus
*Assistant Examiner*—Thanh-Tam Le
(74) *Attorney, Agent, or Firm*—Rosenberg, Klein & Lee

(57) ABSTRACT

An improved structure of a plastic CPU foldable fixing frame primarily comprises a seat and two foldable plates which are pivotally installed at two sides of the seat, a CPU is contained and fixed between the two foldable plates. The seat is formed by two bases symmetric in the left and right sides to be directly fixed to a mother board. A communicated tank is located at the bottom of each of the two bases near the inner lateral surface of the CPU receiving tank. Each of the communicated tank is buckled to a respective CPU receiving tank, so that the force applied point of the conductive elastic piece is along the direction of the CPU receiving tank in the inner side of the base. When a CPU fixing frame on the base is fixed to the mother board by a screw or a rivet, the conductive elastic piece will be connected to the ground wire of the mother board by fixing to the screw or the rivet. Thus, as assembling a CPU, the force applied point of the conductive elastic piece will be in contact with the radiator on the outer surface of the CPU, then by the screw and the ground wire of the mother board, they are electrically connected. Thus, the signal interference from the high-speed transformation of the signal in a computer is reduced, further, the running speed of the CPU is increased.

2 Claims, 4 Drawing Sheets

STRUCTURE OF A PLASTIC CPU FOLDABLE FIXING FRAME

BACKGROUND OF THE INVENTION

1. Field of the Invention

The present invention relates to an improved structure of a plastic CPU foldable fixing frame, and especially to a computer CPU fixing frame made of plastic material, thereby the radiator of the CPU and the grounding wire of the mother board is conducted and the interference to the signal wave is reduced. Therefore, the running speed of the computer is incremented.

2. Description of the Prior Art

The prior art plastic CPU foldable fixing frame is a plastic product, which has bad heat and electric conductivities. Thus, the heat dissipation effect is low, and the running speed of CPU will be dramatically effected. Moreover, other then the inner crystal circuit, the housing of a CPU is nonconductive, thus the ability of preventing electromagnetic interference is bad. The prior art plastic CPU foldable fixing frame substantially has a bad effect than one made of metal. However, the plastic product is beneficial in cost and thus in commercial competition. Therefore, there is an eager demand for a novel plastic CPU foldable fixing frame, by which the defects in the prior art can be improved.

SUMMARY OF THE INVENTION

Accordingly, the object of the present invention is to provide an improved structure of a plastic CPU foldable fixing frame, wherein a conductive structure is installed in the plastic fixing frame so that the radiator of the CPU and the grounding wire of the mother board will conduct. Thus, the heat dissipating effect is increased and the electromagnetic interference within the CPU may be reduced. Therefore, the running speed of CPU is increased.

In order to attain the aforementioned object, the present invention provides an improved structure of a plastic CPU foldable fixing frame primarily comprises a seat and two foldable plates which are pivotally installed at two sides of the seat, a CPU is contained and fixed between the two foldable plates. The plastic CPU foldable fixing frame primarily comprises a seat and two foldable plates which are pivotally installed at two sides of the seat, a CPU is contained and fixed between the two foldable plates. The seat is formed by two bases symmetric in the left and right sides to be directly fixed to a mother board. A communicated tank is located at the bottom of each of the two bases near the inner lateral surface of the CPU receiving tank. Each of the communicated tank is buckled to a respective CPU receiving tank, so that the force applied point of the conductive elastic piece is along the direction of the CPU receiving tank in the inner side of the base.

As the aforementioned structure is assembled, the CPU fixing frame on the base is fixed to the mother board by a screw or a rivet, the conductive elastic piece will be connected to the ground wire of the mother board by fixing to the screw or the rivet. Thus, as assembling a CPU, the force applied point of the conductive elastic piece will be in contact with the radiator on the outer surface of the CPU, then by the screw and the ground wire of the mother board, they are electrically connected. Thus, the signal interference from the high-speed transformation of the signal in a computer is reduced, further, the running speed of the CPU is increased.

The present invention will be better understood and its numerous objects and advantages will become apparent to those skilled in the art by referencing to the following drawings in which:

DETAILED DESCRIPTION OF THE PREFERRED EMBODIMENT

Figure 1:
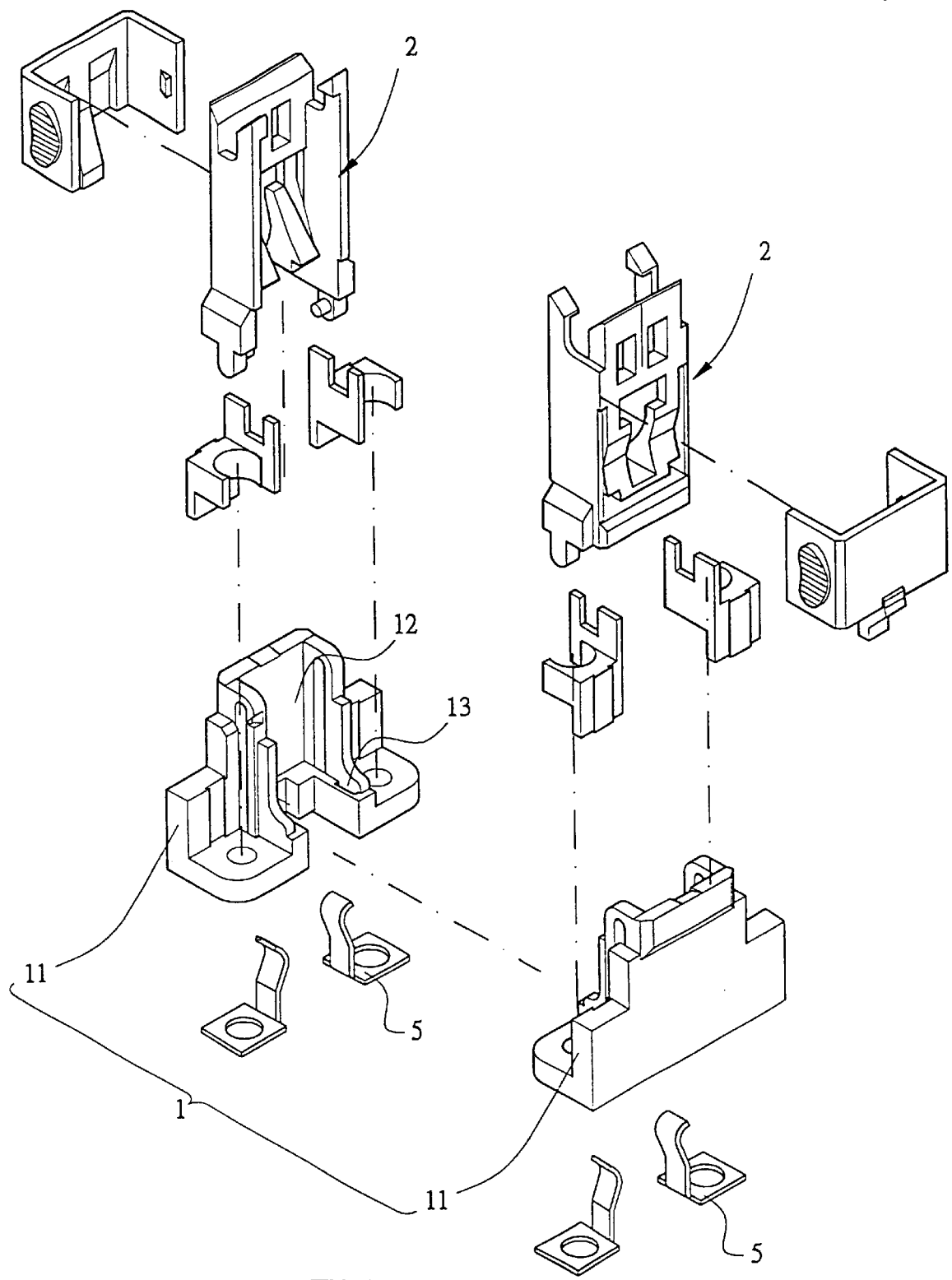
FIG. 1 is a perspective view of the present invention.
Figure 2:
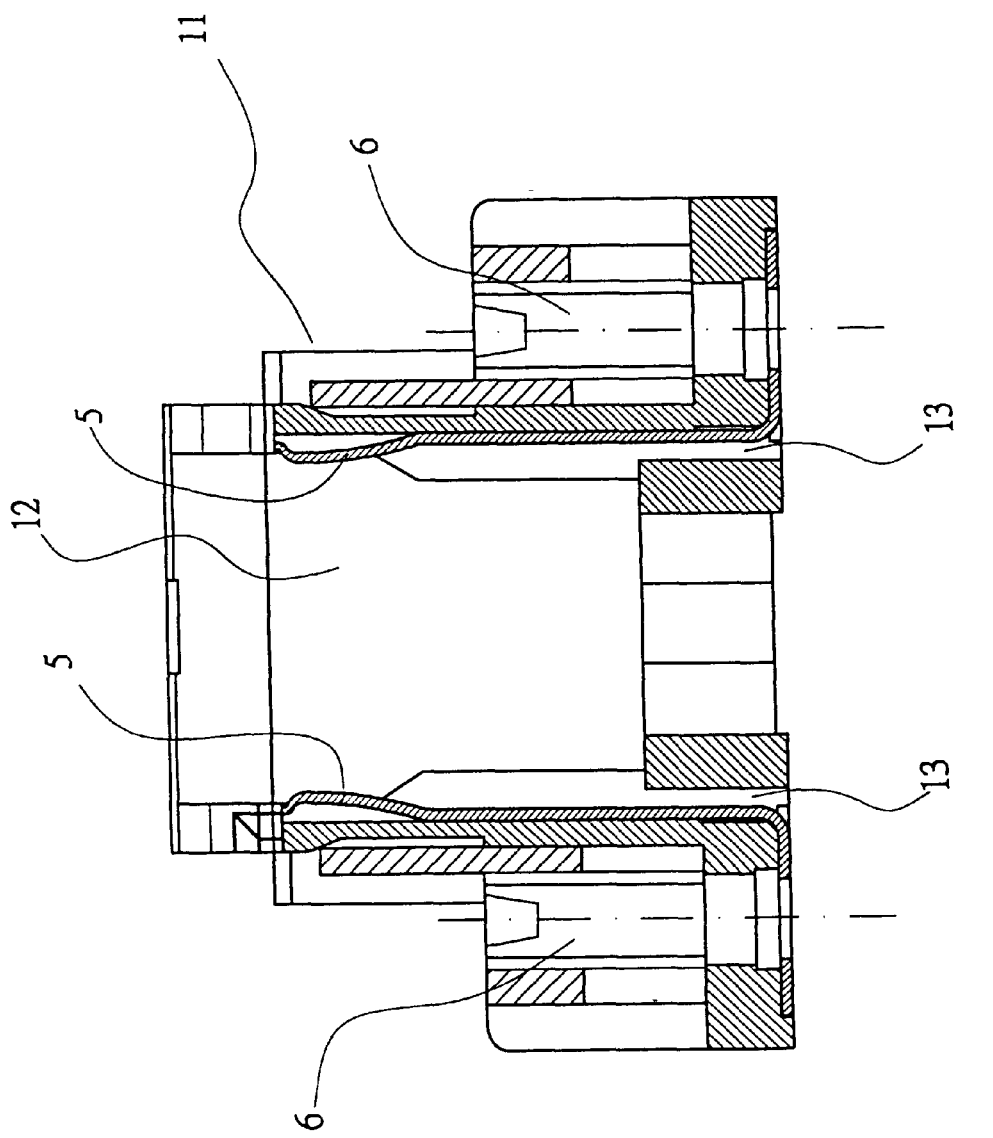
FIG. 2 is a cross sectional view of the present invention.
Figure 3:
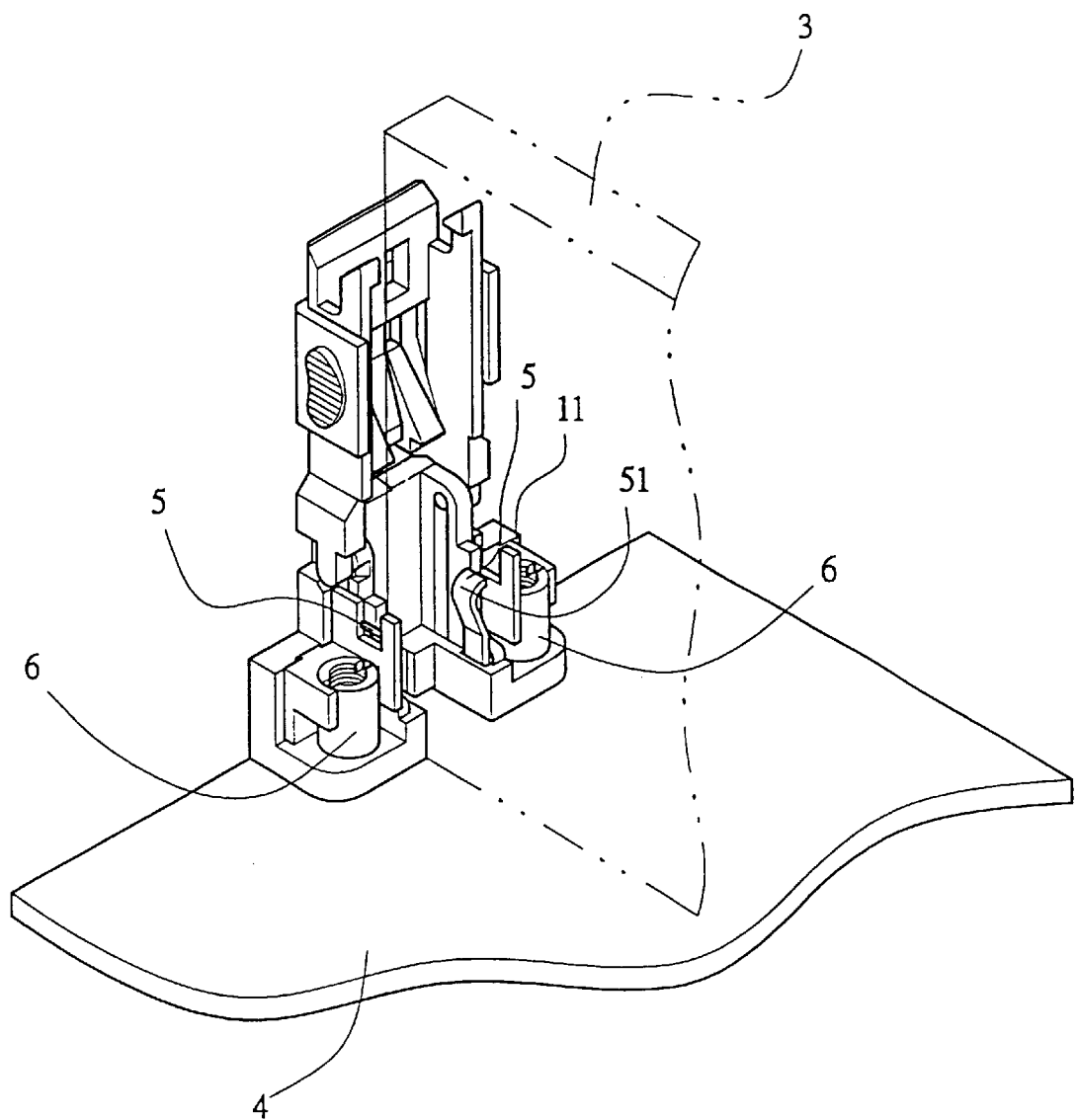
FIG. 3 is a schematic view showing the embodiment of the present invention.

With reference to FIGS. 1 to 3, the improved structure of a plastic CPU foldable fixing frame according to the present invention includes a seat 1, and two foldable plates 2 which are pivotally installed at two sides of the seat 1. A CPU is contained and fixed between the two foldable plates.

The seat 1 is formed by two symmetric bases 11 to be directly fixed to a mother board 4. A communicated tank 13 is located at the bottom of each of the two bases 11 near the inner lateral surface of the CPU receiving tank 12. Each of the communicated tank 13 is buckled with a respective CPU receiving tank 12.

Figure 4:
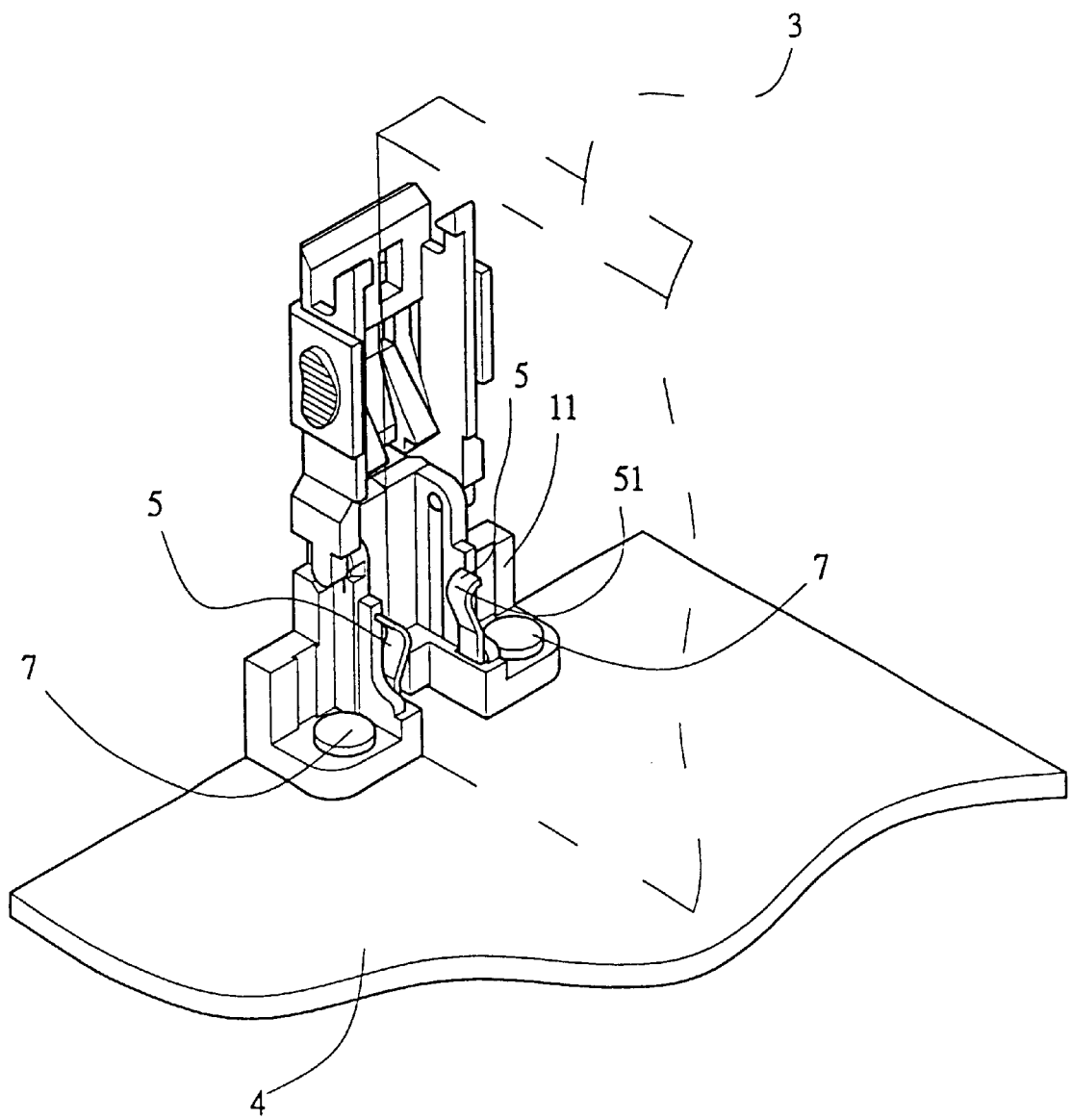
FIG. 4 is a schematic view showing the embodiment of the present invention wherein a rivet is used.

With reference to FIGS. 3 and 4, when a CPU fixing frame on the base is fixed to the mother board 4 by a screw 6 or a rivet 7, the conductive elastic piece 5 will be connected to the ground wire of the mother board 4 by fixing to the screw 6 or the rivet 7. Thus, as assembling a CPU, the force applied point 51 of the conductive elastic piece 5 will be in contact with the radiator on the outer surface of the CPU, then by the screw 6 and the ground wire of the mother board 4, they are electrically connected.

When the aforementioned structure is assembled for being used, the conductive elastic pieces 5 extended in the inner side of the bases 11 of the seat 1 will contact with the housing of the radiator of CPU 3. Moreover, the conductive elastic piece 5 is further connected to the grounding wire of the mother board 4 by the fixing screw. Therefore, part of heat from the operation of the CPU 3 is transferred to the mother board 4 for increasing the heat dissipating area and effect. Moreover, the running speed is increased. Besides, the. electromagnetic interference (EMI) from the high speed operation of the CPU will be reduced due to the action of the conductive elastic piece 5 and the shielding of the CPU radiator, and thus the object of the present invention is achieved.

In summary, the improved structure of a plastic CPU foldable fixing frame primarily according to the present invention substantially increases the running speed of a CPU and reduces the EMI effect.

Although the present invention has been described using specified embodiment, the examples are meant to be illustrative and not restrictive. It is clear that many other variations would be possible without departing from the basic approach, demonstrated in the present invention.

What is claimed is:

1. An improved structure of a plastic CPU foldable fixing frame comprising a seat and two foldable plates which are pivotally installed at two sides of the seat, a CPU is contained and fixed between the two foldable plates, characterized in that:

the seat is formed by two bases disposed in opposed spaced relationship and affixed to a mother board, each of the seats having (a) a first tank formed therein into which the CPU is received, and (b) a second tank formed therein in open communication with the first tank, the seat including a plurality of conductive elastic pieces for electrical connection to a ground connection on the mother board, a respective pair of the plurality of conductive elastic pieces being received in the second tank of each of the bases in spaced opposing relationship, each of the conductive elastic pieces having a force applying portion formed thereon and disposed in the first tank for contacting the CPU to provide a ground connection therewith and dissipate heat therefrom.

2. The improved structure as recited in claim 1 where each of the bases has a pair of holes formed therethrough for receiving a fastener therein to secure the base to the mother board, each conductive elastic piece having a portion thereof with a through opening disposed in aligned relationship with a respective one of the holes of the base for electrical connection to the ground connection on the mother board.

* * * * *